(12) United States Patent
Zaidi et al.

(10) Patent No.: US 6,954,002 B2
(45) Date of Patent: Oct. 11, 2005

(54) SYSTEM AND METHOD OF ENHANCING ALIGNMENT MARKS

(75) Inventors: Shoaib H. Zaidi, Poughkeepsie, NY (US); Gary Williams, Mechanicsville, VA (US); Alois Gutmann, Poughkeepsie, NY (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 10/230,493

(22) Filed: Aug. 29, 2002

(65) Prior Publication Data

US 2004/0041283 A1 Mar. 4, 2004

(51) Int. Cl.⁷ .................. H01L 29/06; H01L 23/544
(52) U.S. Cl. .............. 257/797; 257/622; 257/623; 257/618
(58) Field of Search .................. 257/618, 619, 257/620, 621, 622, 623, 624, 625, 626, 627, 628, 629, 797

(56) References Cited

U.S. PATENT DOCUMENTS 5,682,243 A * 10/1997 Nishi .................... 356/401
6,242,754 B1 * 6/2001 Shiraishi ................ 250/548

OTHER PUBLICATIONS

Zaidi, Saleem H., et al., *Characterization of Si Nanostructured Surfaces*, SPIE Conference on Engineered Nanostructural Films and Materials, Denver, Colorado, Jul. 1999, pp. 151–159.
Hadobas, K., et al., *Reflection Properties of Nanostructure-arrayed silicon surfaces*, Nanotechnology 11 (2000) 161–164.

* cited by examiner

Primary Examiner—Nathan J. Flynn
Assistant Examiner—Victor A. Mandala, Jr.

(57) ABSTRACT

A semiconductor wafer comprises a semiconductor substrate, a surface alignment mark visible on the semiconductor surface and a plurality of nanostructures on the surface of the surface alignment mark having an average pitch adapted to reduce reflectivity of the surface alignment mark in a predetermined light bandwidth.

10 Claims, 5 Drawing Sheets

SYSTEM AND METHOD OF ENHANCING ALIGNMENT MARKS

BACKGROUND OF THE INVENTION

1. Field of the Invention

The present invention relates to the lithographic processing of semiconductor wafers, and more particularly to suppressing alignment mark reflection.

2. Discussion of the Prior Art

To align a film mask with a semiconductor wafer surface, an alignment mark on the film mask can be aligned with an etched mark on the wafer. Alignment marks in lithographic processes can be difficult to use because of the level of contrast between the mark and the surrounding area. Alignment marks can be used for lithographic processing of semiconductor wafers where light is projected through the film mask onto the surface of a wafer coated with a photo-sensitive material. A substantial contributor to reduced contrast between the alignment mark and surrounding structures is light reflection.

Reflection can be reduced through the use of thin-film coatings, wherein the thin-film coatings are anti-reflective (AR) films. AR films can be employed on the surfaces of solar cells, light-sensitive detectors, displays, lenses, and the like, to suppress undesirable Fresnel reflections.

Another method for reducing reflection is to provide an incident surface with a periodically structured array, such that the periodicity is smaller than the wavelength of the incident light. Such a surface behaves like an effective medium, in which the effective index of refraction changes continuously from that of the air to that of the material. The result is that incident light is reflected at every depth of the structure, such that the reflected light is out of phase, thereby generating destructive interference.

Surface texturing of silicon surfaces to enhance absorption is known for solar cell surfaces. For solar cells, surface textures comprising arrays of microscopic pyramids have been used on to increase absorption of incident light. These structures can be formed by a process known as interferometric lithography, also known as optical interference lithography.

However, no known system or method current exists in the field of semiconductor lithography for reducing the reflectivity of an alignment mark using surface texturing. Therefore, a need exists for a system and method of suppressing reflection of an alignment mark and thereby increasing contrast.

SUMMARY OF THE INVENTION

A semiconductor wafer according to an embodiment of the present invention comprises a semiconductor substrate, a surface alignment mark visible on the semiconductor surface and a plurality of nanostructures on the surface of the surface alignment mark having an average pitch adapted to reduce reflectivity of the surface alignment mark in a predetermined light bandwidth.

Each of the plurality of nanostructures has substantially the same pitch. The average pitch of the plurality of nanostructures is substantially equal to a periodicity of the nanostructures. The pitch is less than about 220 nm.

The plurality of nanostructures are rectilinear. The plurality of nanostructures are raised structures. The plurality of nanostructures are depressed structures. The semiconductor substrate is substantially smooth.

According to an embodiment of the present invention, a semiconductor wafer comprises a semiconductor substrate and a plurality of nanostructures on a portion of the surface of the semiconductor substrate having an average pitch adapted to reduce reflectivity in a predetermined light bandwidth, wherein the plurality of nanostructures appear as a surface alignment mark.

Each of the plurality of nanostructures has substantially the same pitch. The average pitch of the plurality of nanostructures is substantially equal to a periodicity of the nanostructures. The pitch is less than about 220 nm.

The plurality of nanostructures are raised rectilinear structures. The plurality of nanostructures are depressed rectilinear structures.

BRIEF DESCRIPTION OF THE DRAWINGS

Preferred embodiments of the present invention will be described below in more detail, with reference to the accompanying drawings.

DETAILED DESCRIPTION OF PREFERRED EMBODIMENTS

By segmenting an alignment mark into a number of smaller features, reflection can be suppressed. The small features can reduce reflection, and ensure a high contrast, dark alignment mark. This suppression can improve as the ratio of the pitch of the constituent features decreases relative to the illuminating wavelength.

Figure 1:
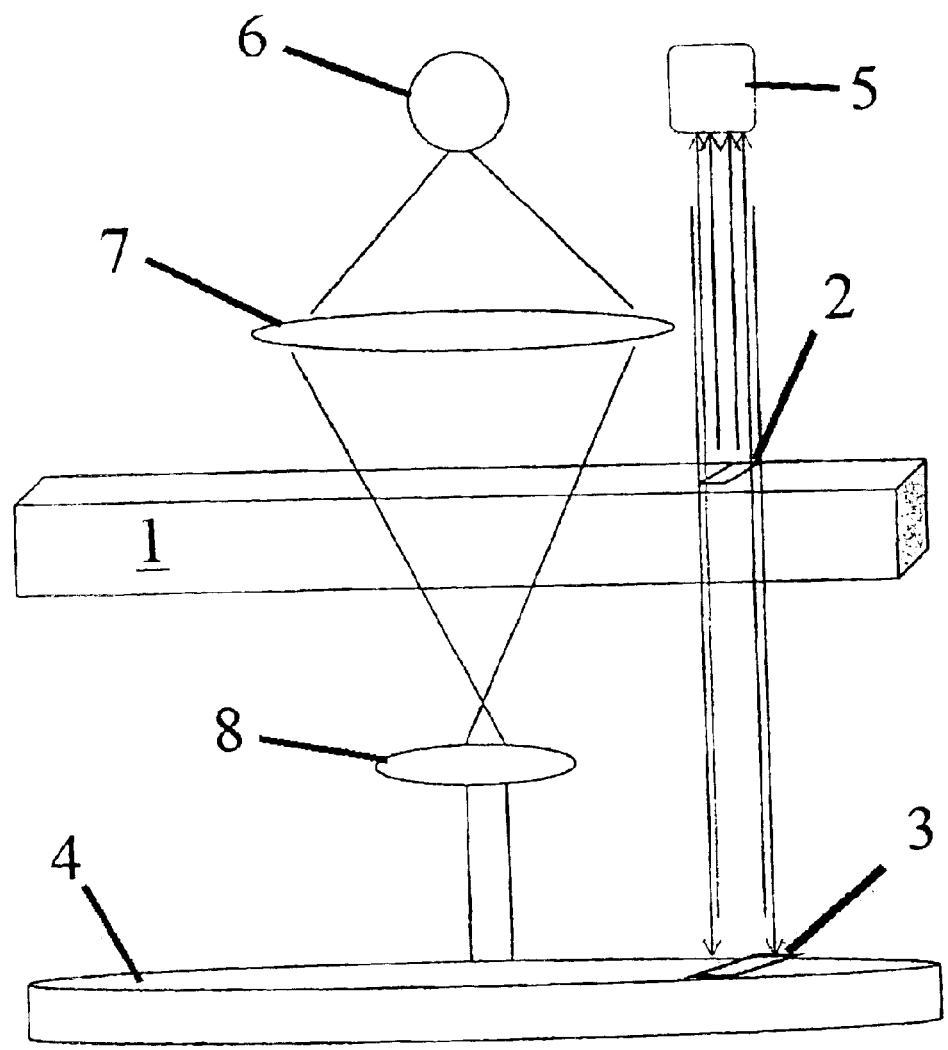
FIG. 1 is an diagram of a system according to an embodiment of the present invention.

Referring to FIG. 1, a thin film mask 1 having a mask alignment mark 2 is aligned with a corresponding surface alignment mark 3 on a semiconductor surface 4. An optical alignment device 5 is provided, which provides illumination over a range of wavelengths. An operator can peer down and align the mask alignment mark 2 with the surface alignment mark 3 manually. The optical alignment device can be automated via digital imaging to align the mask alignment mark 2 with the surface alignment mark 3. When the marks are aligned, a lithographic light source 6 can be activated. The light can be passed through a light condenser 7, through the mask 1, and through a reduction lens 8 that focuses the mask image onto the semiconductor surface 4, which has been coated with a light sensitive film (not shown). A mask pattern can be there after be etched into the film.

Figure 2:
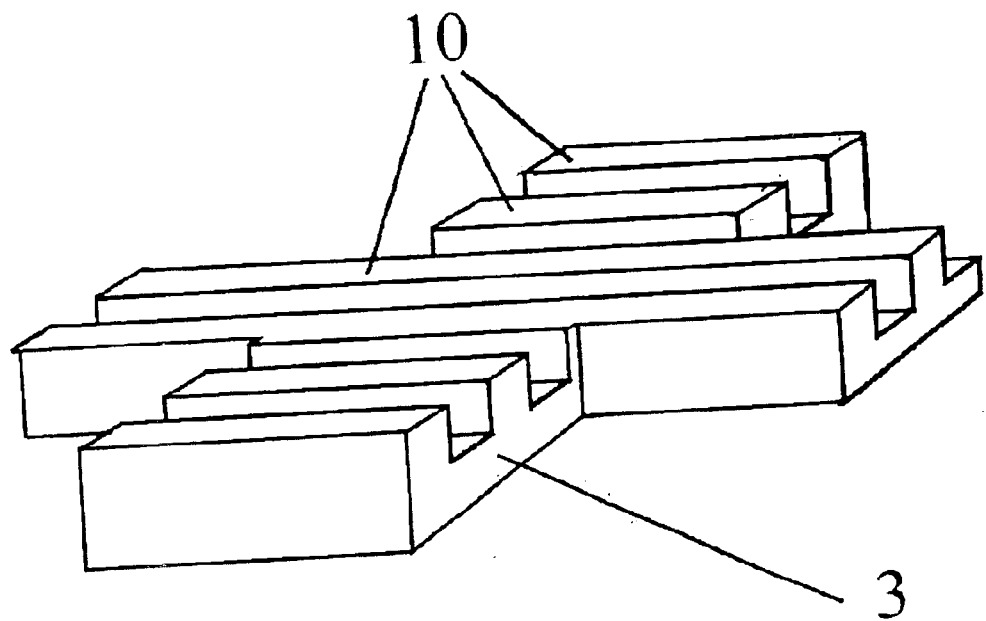
FIG. 2 is an alignment structure according to an embodiment of the present invention.

Referring to FIG. 2, the surface alignment mark 3 is shown as a raised cross of etchable material disposed upon a semiconductor surface (not shown). The alignment mark 3 can be a depression or a raised structure. Alternatively, the alignment mark 3 can be level with the semiconductor surface and be defined by surrounding trenches. Further, the alignment mark 3 can be any shape that the manufacturer finds conducive to precise alignment. Upon the alignment mark 3 are a plurality of nanoscale features 10.

Figure 3A:
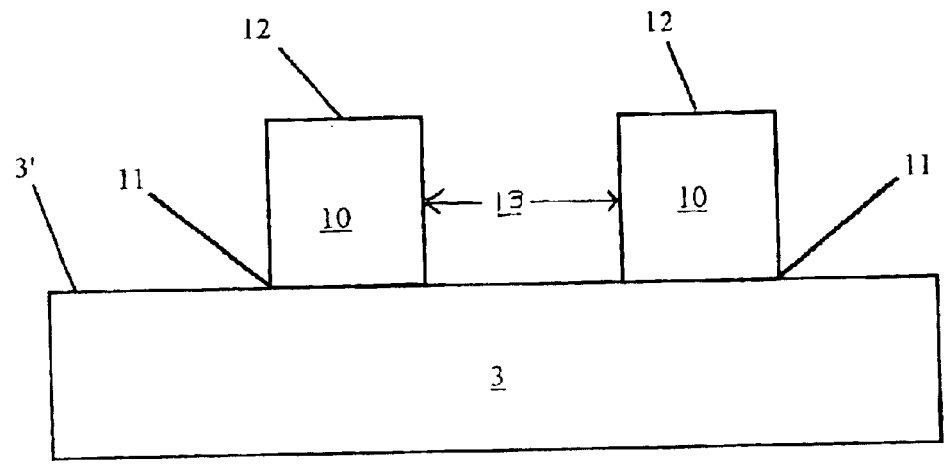
FIGS. 3a and 3b are cross-sectional views of alignment marks according to an embodiment of the present invention.
Figure 3B:
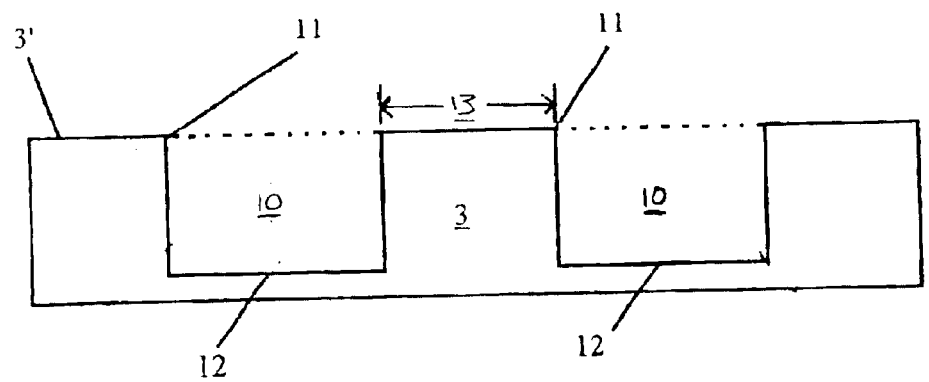

Referring to FIGS. 3a and 3b, each nanoscale feature 10 has a proximate end 11 and a distal end 12, referring to their disposition with respect to the semiconductor surface 3' of the alignment mark 3. The proximate end 11 representing that coincident with the surface and the distal end 12 being that further away. Here, where the features are raised as in FIG. 3a, the distal end is above the surface, meaning the tips of the nanoscale features. For depressed features, such as for example, the rectangular channels shown in FIG. 3b, then the distal end 12 of each feature is below the semiconductor surface 3' of the mark 3.

The distance between the nanoscale features 13 is referred to as the pitch. The relationship between reflectivity, pitch and wavelength can be written as:

$$r = p/\lambda$$

where r is the reflectivity of the mark, p is the average pitch between features, and $\lambda$ is the wavelength of the incident light (e.g., the ambient light at the optical device 5 from FIG. 1). This is to be distinguished from the periodicity P of the features, which is the distance between the positions of the features. For a pointed feature, such as a pyramid or cone, the pitch p at the pointed tip is equal to the periodicity P. For nanoscale features of substantially rectilinear structures such as the channels shown in FIG. 3b, p=P.

Reflection of incident light from the nanoscale features can result in destructive interference and decrease reflectivity r dependent upon the average pitch p. This will vary with the semiconductor surface material and the light source. Typically, current mask alignment in the semiconductor art is performed under broadband red light, wherein the material to be masked is silicon or an oxide of nitride. Accordingly, for broadband red light the pitch p can be about 220 nm or less. Hence, for the rectilinear structures shown, the average pitch is at about 220 nm or less.

Figure 4:
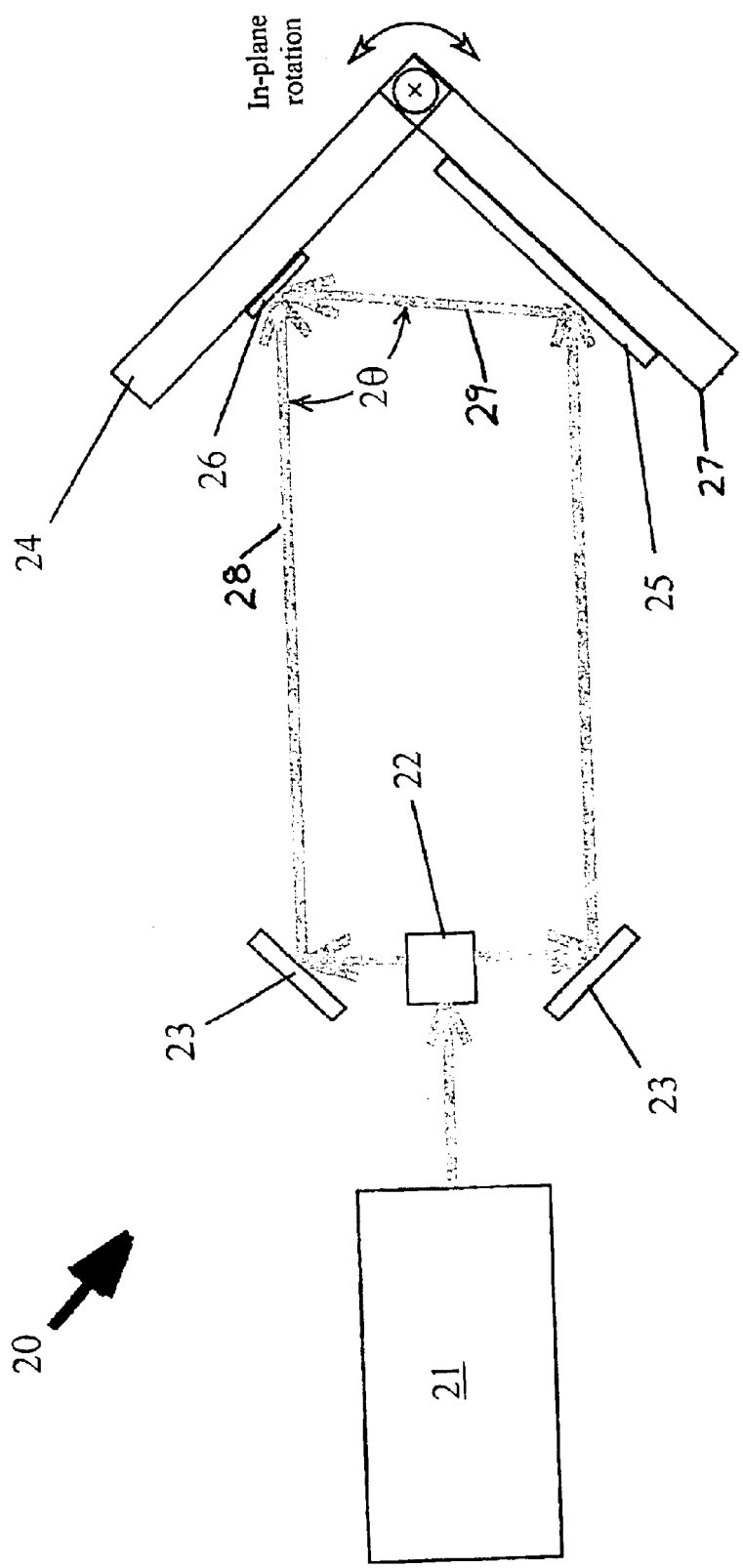
FIG. 4 is a laser system for interferometric lithography according to an embodiment of the present invention.

Referring to FIG. 4, an interferometric system 20 comprises a laser 21, a beam splitter 22 and mirrors 23. The expanded and collimated laser beam is incident on a Fresnel mirror arrangement mounted on a rotation stage for period variation. The rotation stage comprises a mirror stage 27 and a sample stage 24. A sample 26 can be supported by the sample stage 24. A mirror 25 can be supported by the mirror stage 27. The mirror stage 27 and sample stage 24 can have tilt and tip adjustments, the sample stage 24 can be equipped with in-plane rotation adjustment. The interference between the two beams, the incident 28, and the reflected 29, results in a periodic pattern, whose pitch can be varied by a computer-controlled rotation stage.

Figure 5:
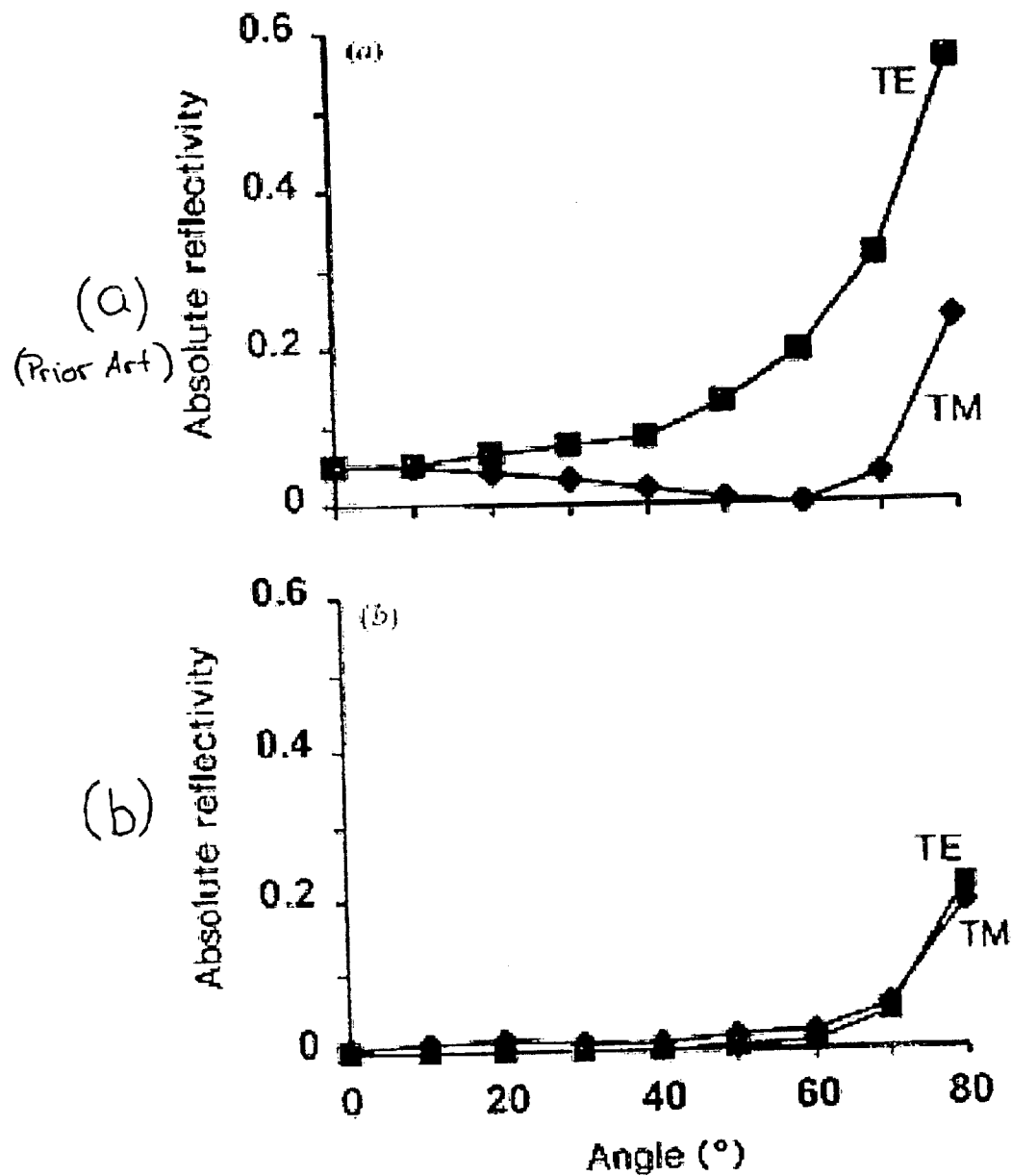
FIG. 5a is a graph showing reflectivity vs. angle for a semiconductor wafer.
FIG. 5b is a graph showing reflectivity vs. angle for a semiconductor wafer according to an embodiment of the present invention.

Referring to FIGS. 5a and 5b, it is found that by reducing the reflection of the alignment marks, that the marks appear more defined in relation to the rest of the semiconductor surface. This permits improved accuracy in aligning thin-film masks to semiconductor surfaces. FIGS. 5a and 5b show an absolute mean reflectivity plotted against the angle of reflected light from the semiconductor surface. The incident light was at 90 degrees, normal to the surfaces tested. The incident light used had a wavelength range of from 450 to 700 nanometers. Plots were generated for both polarizations, TE and TM. The polarizations are two orthogonal linear polarizations. Where the electrical field of the wave is perpendicular to the plane of incidence, it is called TE polarized; if the magnetic field of the wave is perpendicular to the plane of incidence, it is called TM polarized.

FIG. 5a shows the results for a flat semiconductor surface coated with Shipley AZ-1805 photoresist. FIG. 5b shows the results for a semiconductor surface having rectilinear nanoscale features having a groove depth of 146 nanometers and an a pitch of 240 nanometers, manufactured using Shipley AZ-1805 photoresist as the masking material. Typical noise levels are about 1% with a scaling uncertainty of ±1%.

As can be seen the absolute reflectivity of the nanoscale features demonstrates substantial improvement in reducing reflection at all angles regardless of the polarization of the incident light. The result is increased contrast, allowing greater precision in alignment.

Having described embodiments for a system and method for suppressing reflection of an alignment mark, it is noted that modifications and variations can be made by persons skilled in the art in light of the above teachings. It is therefore to be understood that changes may be made in the particular embodiments of the invention disclosed which are within the scope and spirit of the invention as defined by the appended claims. Having thus described the invention with the details and particularity required by the patent laws, what is claimed and desired protected by Letters Patent is set forth in the appended claims.

What is claimed is:

1. A semiconductor wafer comprising:

a semiconductor substrate;

a surface alignment mark visible on the semiconductor surface;

a plurality of nanostructures on the surface of the surface alignment mark having an average pitch of less than about 220 nm for reducing reflectivity of the surface alignment mark in a broadband red light wavelength range of 450 to 700 nm provided by an optical alignment device.

2. The semiconductor wafer of claim 1, wherein each of the plurality of nanostructures has substantially the same pitch.

3. The semiconductor wafer of claim 1, the plurality of nanostructures are rectilinear.

4. The semiconductor wafer of claim 1, wherein the plurality of nanostructures are raised structures.

5. The semiconductor wafer of claim 1, wherein the plurality of nanostructures are depressed structures.

6. The semiconductor wafer of claim 1 wherein the semiconductor substrate is substantially smooth.

7. A semiconductor wafer comprising:

a semiconductor substrate;

a plurality of nanostructures on a portion of the surface of the semiconductor substrate having an average pitch of less than about 220 nm for reducing reflectivity in a broadband red light wavelength range of 450 to 700 nm provided by an optical alignment device, wherein the plurality of nanostructures appear as a surface alignment mark.

8. The semiconductor wafer of claim 7, wherein each of the plurality of nanostructures has substantially the same pitch.

9. The semiconductor wafer of claim 7, wherein the plurality of nanostructures are raised rectilinear structures.

10. The semiconductor wafer of claim 7, wherein the plurality of nanostructures are depressed rectilinear structures.

* * * * *